US009292147B2

(12) United States Patent
Teramoto

(10) Patent No.: US 9,292,147 B2
(45) Date of Patent: Mar. 22, 2016

(54) DISPLAY DEVICE WITH TOUCH PANEL

(71) Applicants: Japan Display Inc., Tokyo (JP);
Panasonic Liquid Crystal Display Co., Ltd., Himeji-shi (JP)

(72) Inventor: Masahiro Teramoto, Mobara (JP)

(73) Assignees: Japan Display Inc., Tokyo (JP);
Panasonic Liquid Crystal Display Co., Ltd., Himeji-shi (JP)

( * ) Notice: Subject to any disclaimer, the term of this patent is extended or adjusted under 35 U.S.C. 154(b) by 0 days.

(21) Appl. No.: 14/591,440

(22) Filed: Jan. 7, 2015

(65) Prior Publication Data

US 2015/0122771 A1 May 7, 2015

Related U.S. Application Data

(63) Continuation of application No. 14/166,054, filed on Jan. 28, 2014, now Pat. No. 8,941,616, which is a continuation of application No. 13/798,372, filed on Mar. 13, 2013, now Pat. No. 8,643,627, which is a continuation of application No. 12/427,878, filed on Apr. 22, 2009, now Pat. No. 8,436,830.

(30) Foreign Application Priority Data

Apr. 22, 2008 (JP) .................................. 2008-111414

(51) Int. Cl.
*H01B 13/00* (2006.01)
*C03C 15/00* (2006.01)
(Continued)

(52) U.S. Cl.
CPC .............. *G06F 3/044* (2013.01); *G06F 3/0412* (2013.01); *H01L 21/044* (2013.01); *H01L 21/0425* (2013.01); *H01L 21/311* (2013.01); *H01L 21/3213* (2013.01); *H05K 3/0017* (2013.01);
(Continued)

(58) Field of Classification Search
None
See application file for complete search history.

(56) References Cited

U.S. PATENT DOCUMENTS 4,639,720 A 1/1987 Rympaiski et al.
5,374,787 A 12/1994 Miller et al.
(Continued)

FOREIGN PATENT DOCUMENTS

CN 101131492 2/2008
JP 58-166437 10/1983
(Continued)

OTHER PUBLICATIONS

Office Action dated on Feb. 10, 2015 regarding Japanese Patent Application No. 2013-243921.

*Primary Examiner* — Stephanie Duclair
(74) *Attorney, Agent, or Firm* — Typha IP LLC

(57) ABSTRACT

A manufacturing method of a touch panel includes the steps of providing a substrate, forming a first conductive film on the substrate, forming a first mask on the first conductive film, etching the first conductive film to form electrode portions and lower intersect portions of the touch panel, forming an insulating film made of a negative resist on the first conductive film, and forming a contact hole above the electrode portion by removing the insulating film. The steps further include forming a second conductive film on the insulating film, forming a second mask on the second conductive film, etching the second conductive film to form an upper intersect portion connected between two adjacent electrode portions via the contact hole and intersecting with the lower intersect portion, and forming protective film on the second conductive film.

15 Claims, 8 Drawing Sheets

(51) Int. Cl.

| | |
|---|---|
| *C03C 25/68* | (2006.01) |
| *C23F 1/00* | (2006.01) |
| *G06F 3/044* | (2006.01) |
| *H01L 21/04* | (2006.01) |
| *H01L 21/311* | (2006.01) |
| *H01L 21/3213* | (2006.01) |
| *G06F 3/041* | (2006.01) |
| *H05K 3/00* | (2006.01) |

(52) U.S. Cl.
CPC ............... *G06F 2203/04103* (2013.01); *G06F 2203/04111* (2013.01)

(56) References Cited

U.S. PATENT DOCUMENTS

| | | | |
|---|---|---|---|
| 5,952,998 | A | 9/1999 | Clancy |
| 6,177,968 | B1 | 1/2001 | Okada et al. |
| 7,920,129 | B2 | 4/2011 | Hotelling |
| 7,995,041 | B2 | 8/2011 | Chang |
| 8,436,830 | B2 | 5/2013 | Teramoto |
| 2004/0119701 | A1 | 6/2004 | Mulligan et al. |
| 2005/0156906 | A1 | 7/2005 | Chiu et al. |
| 2005/0270273 | A1 | 12/2005 | Marten |
| 2007/0229470 | A1 | 10/2007 | Snyder |
| 2007/0242054 | A1 | 10/2007 | Chang et al. |
| 2007/0273560 | A1 | 11/2007 | Hua et al. |
| 2008/0264699 | A1* | 10/2008 | Chang et al. ............... 178/18.01 |
| 2008/0309633 | A1 | 12/2008 | Hotelling |
| 2008/0309635 | A1* | 12/2008 | Matsuo ..................... 345/173 |
| 2009/0009486 | A1 | 1/2009 | Sato et al. |
| 2010/0026661 | A1 | 2/2010 | Teramoto |
| 2010/0066701 | A1 | 3/2010 | Ningrat |

FOREIGN PATENT DOCUMENTS

| | | |
|---|---|---|
| JP | S58-166437 A | 10/1983 |
| JP | 2004-265100 A | 9/2004 |
| JP | 2008-065748 | 3/2008 |
| JP | 2009-015489 | 1/2009 |

* cited by examiner

PRIOR ART

PRIOR ART

DISPLAY DEVICE WITH TOUCH PANEL

CROSS-REFERENCE TO RELATED APPLICATION

This application is a continuation of U.S. application Ser. No. 14/166,054, filed Jan. 28, 2014, which is a continuation of U.S. application Ser. No. 13/798,372, filed Mar. 13, 2013, now U.S. Pat. No. 8,643,627, which is a continuation of U.S. application Ser. No. 12/427,878, filed Apr. 22, 2009, now U.S. Pat. No. 8,436,830, the contents of which are incorporated herein by reference.

The present application claims priority from Japanese application JP 2008-111414 filed on Apr. 22, 2008, the content of which is hereby incorporated by reference into this application.

BACKGROUND OF THE INVENTION

1. Field of the Invention

The present invention relates to a display device with a touch panel, and more particularly, to a display device with a touch panel which includes a capacitance coupling type touch panel.

2. Description of the Related Art

Major systems adopted by conventional touch panels include a system of detecting an optical change and a system of detecting a change in electric characteristic. As systems of detecting a change in electric characteristic, a capacitance coupling system is known (see, for example, JP 2008-65748 A and JP 2009-015489 A).

FIGS. 9 to 11 illustrate a conventional capacitance coupling type touch panel. FIG. 9 is a plan diagram illustrating an electrode pattern, FIG. 10 is a sectional diagram illustrating a sectional structure cut on the line X-X of FIG. 9, and FIG. 11 is a sectional diagram illustrating a sectional structure cut on the line XI-XI of FIG. 9.

As illustrated in FIGS. 9 to 11, the conventional capacitance coupling type touch panel includes a plurality of electrodes 1X extending in a first direction (e.g., X direction) and being disposed in parallel in a second direction (e.g., Y direction) intersecting the first direction, and a plurality of electrodes 2Y intersecting the electrodes 1X, extending in the second direction, and being disposed in parallel in the first direction. The plurality of electrodes 2Y are disposed on a substrate 11 to be covered with an insulating film 12 formed thereon. The plurality of electrodes 1X are disposed on the insulating film 12 to be covered with a protective film 13 formed thereon. The electrodes 1X and 2Y are made of transparent conductive materials such as indium tin oxides (ITOs).

In the conventional capacitance coupling type touch panel, as illustrated in FIGS. 9 to 11, the plurality of electrodes 1X and the plurality of electrodes 2Y are formed on different conductive layers (upper and lower layers) via the insulating film 12. In the case of this electrode structure, distortion occurs in the protective film 13 formed on the insulating film 12 and the electrodes 1X of the upper layer because of the electrode 1X of the upper layer, and optical path lengths are different between the upper and lower layers with respect to a reflected light. Thus, a color difference is generated between the upper electrodes 1X and the lower electrodes 2Y, making electrode patterns of the electrodes 1X and 2Y visible. Such visible electrode patterns cause deterioration of optical characteristics and reduction in characteristics of a display device incorporating the touch panel. Thus, countermeasures are necessary.

SUMMARY OF THE INVENTION

It is an object of the present invention to provide a technology capable of suppressing reduction in characteristics of a display device with a touch panel.

This and other objects and novel features of the present invention become apparent upon reading of the detailed description of the invention in conjunction with the accompanying drawings.

A typical aspect of the invention disclosed in this application is briefly outlined as follows.

(1) A display device with a touch panel includes: a display panel; and a capacitance coupling type touch panel disposed on a surface of an observer side of the display panel, in which: the capacitance coupling type touch panel includes on a substrate, a plurality of first electrodes extending in a first direction and being disposed in parallel in a second direction intersecting the first direction, and a plurality of second electrodes intersecting the plurality of first electrodes, extending in the second direction, and being disposed in parallel in the first direction; each of the plurality of first electrodes includes a first portion formed on a layer different from a layer of the plurality of second electrodes to intersect one of the plurality of second electrodes, and a second portion formed on the same layer as the layer of the plurality of second electrodes separately from the plurality of second electrodes; and the first portion is connected to the second portion via a contact hole formed through an insulating film formed between the first portion and the plurality of second electrodes.

(2) In the display device with the touch panel according to item (1), the first portion of the plurality of first electrodes is formed above the plurality of second electrodes.

(3) In the display device with the touch panel according to item (1), the first portion of the plurality of first electrodes is formed below the plurality of second electrodes.

(4) In the display device with the touch panel according to any one of items (1) to (3), each of the plurality of second electrodes includes a portion wider than a portion intersecting the plurality of first electrodes between the plurality of first electrodes; and the each of the plurality of first electrodes includes a portion wider than a portion intersecting the plurality of second electrodes between the plurality of second electrodes.

(5) In the display device with the touch panel according to any one of items (1) to (4), the plurality of first electrodes and the plurality of second electrodes are made of transparent conductive materials.

(6) The display device with the touch panel according to any one of items (1) to (5) further includes a protective film formed on the substrate to cover the plurality of first electrodes and the plurality of second electrodes.

The present invention enables suppression of reduction in characteristics of the display device with the touch panel.

DETAILED DESCRIPTION OF THE INVENTION

Figure 1:
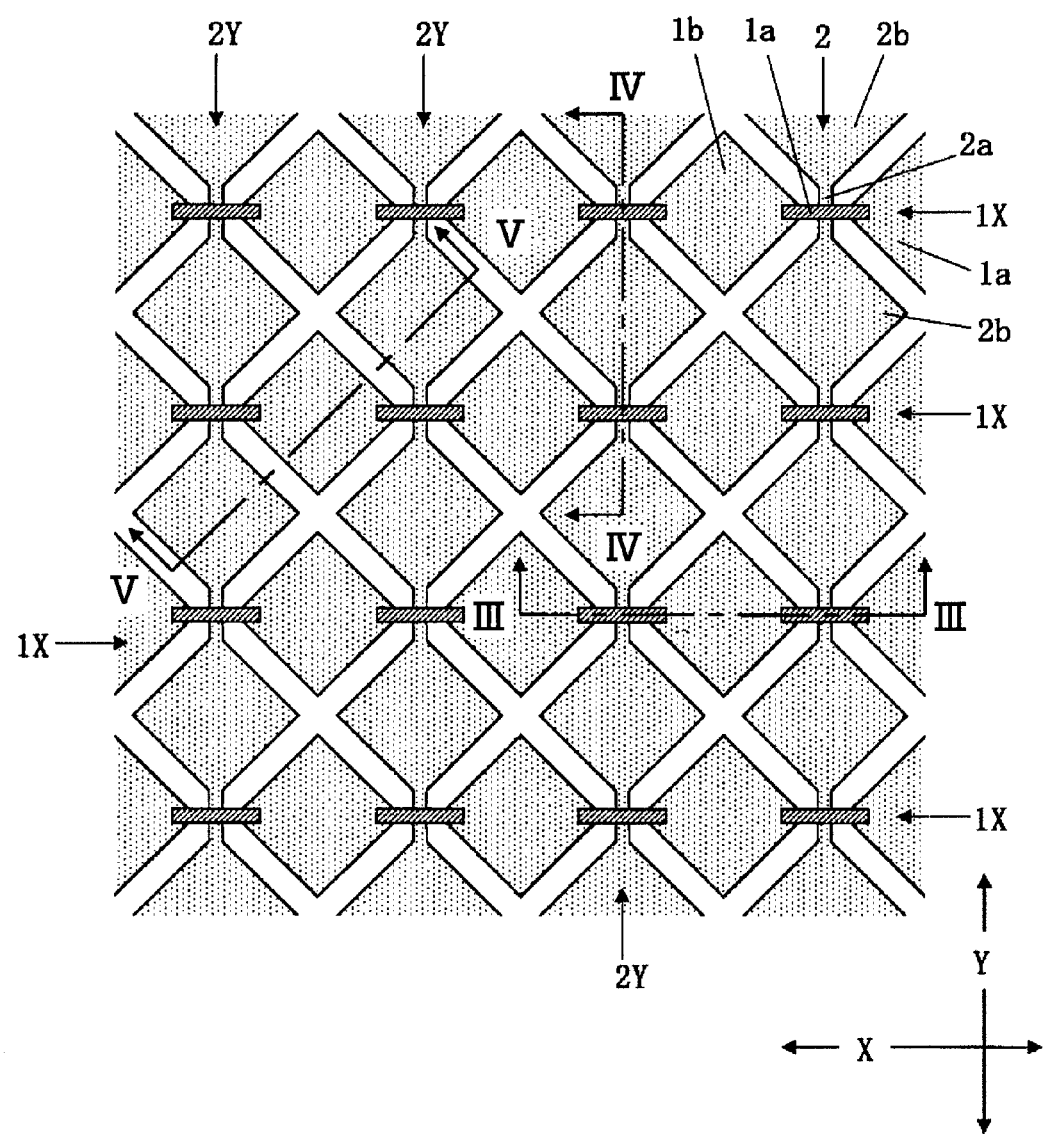
FIG. 1 is a plan diagram illustrating electrode patterns of a touch panel incorporated in a display device with a touch panel according to a first embodiment of the present invention.

Hereinafter, referring to the drawings, embodiments of the present invention are described in detail. Throughout the drawings illustrative of the embodiments of the present invention, similar functions are denoted by similar reference numerals and symbols, and repeated description thereof is avoided.

First Embodiment

A first embodiment of the present invention is described by way of example in which the present invention is applied to a display device with a touch panel, which includes the touch panel on a display panel such as a liquid crystal display panel.

Figure 2:
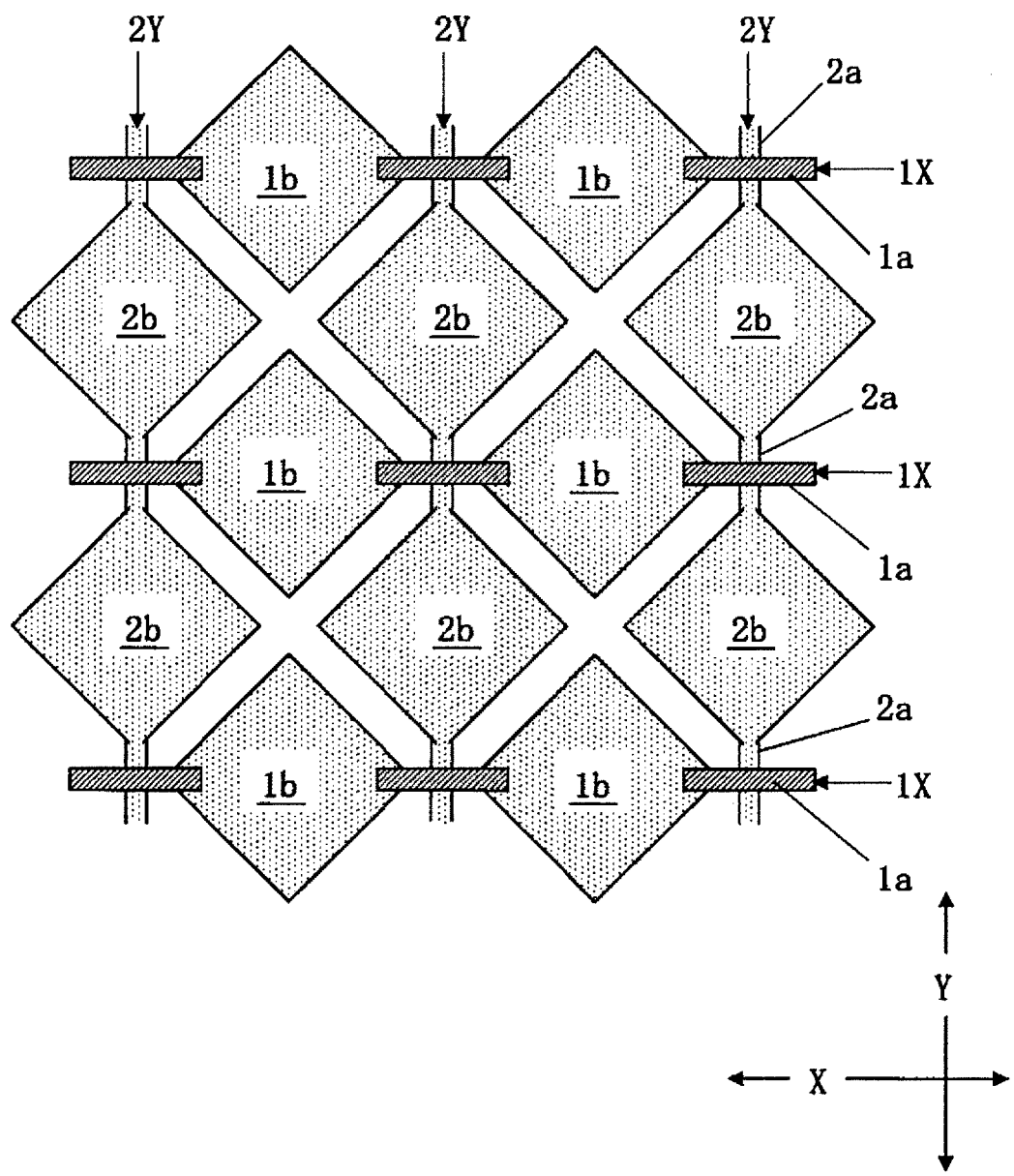
FIG. 2 is an enlarged plan diagram of a part of FIG. 1.
Figure 3:
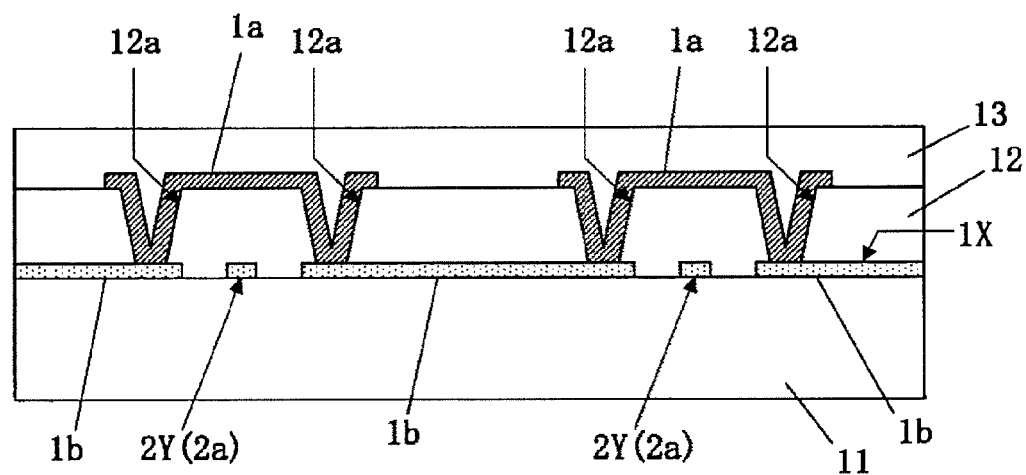
FIG. 3 is a sectional diagram illustrating a sectional structure cut on the line III-III of FIG. 1.
Figure 4:
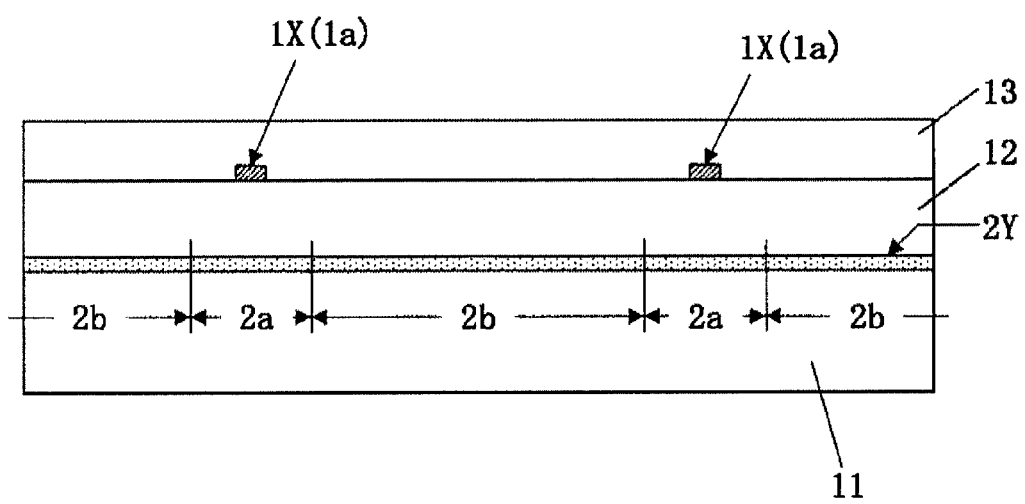
FIG. 4 is a sectional diagram illustrating a sectional structure cut on the line IV-IV of FIG. 1.
Figure 5:
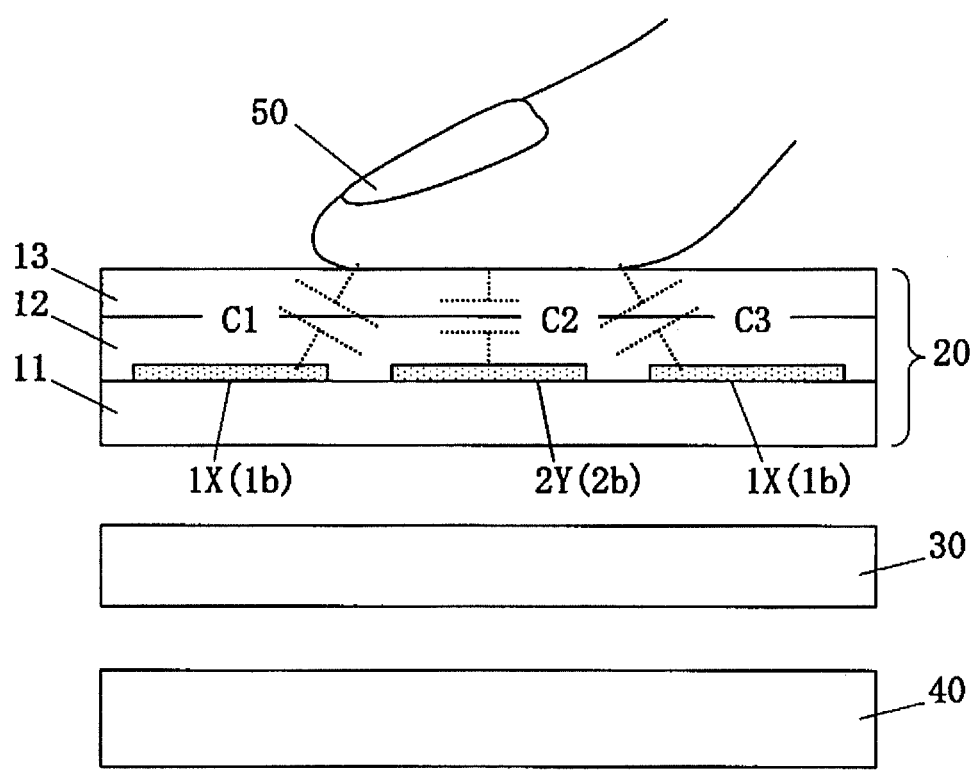
FIG. 5 is a block diagram illustrating a schematic configuration of the display device with the touch panel according to the first embodiment of the present invention.

FIGS. 1 to 5 illustrate the display device with the touch panel according to the first embodiment of the present invention:

FIG. 1 is a plan diagram illustrating electrode patterns of a touch panel incorporated in the display device with the touch panel;

FIG. 2 is an enlarged plan diagram of a part of FIG. 1;

FIG. 3 is a sectional diagram illustrating a sectional structure cut on the line III-III of FIG. 1;

FIG. 4 is a sectional diagram illustrating a sectional structure cut on the line IV-IV of FIG. 1; and FIG. 5 is a block diagram illustrating a schematic configuration of the display device with the touch panel.

In FIG. 5, a touch panel 20 illustrates a sectional structure cut on the line V-V of FIG. 1.

As illustrated in FIG. 5, the display device with the touch panel of the first embodiment includes a liquid crystal display panel 30, the capacitance coupling type touch panel 20 disposed on a surface of an observer side of the liquid crystal display panel 30, and a backlight 40 disposed below a surface opposed to the observer side of the liquid crystal display panel 30. For the liquid crystal display panel 30, for example, a liquid crystal display panel of an in-plane switching (IPS) type, a twisted nematic (TN) type or a vertical alignment (VA) type is used.

As illustrated in FIGS. 1 to 4, the touch panel 20 includes a plurality of electrodes 1X extending in a first direction (e.g., X direction) and being disposed in parallel at predetermined array pitches in a second direction (e.g., Y direction) intersecting the first direction, and a plurality of electrodes 2Y intersecting the electrodes 1X, extending in the second direction, and being disposed in parallel at predetermined array pitches in the first direction.

The plurality of electrodes 2Y are each formed with an electrode pattern in which a plurality of first portions 2a and a plurality of second portions 2b wider than the first portions 2a are alternately arranged in the second direction. The plurality of electrodes 2Y are each disposed on a surface of an observer side of a substrate 11 to be covered with an insulating film 12 formed thereon. For the substrate 11, a transparent insulating substrate such as glass is used.

The plurality of electrodes 1X are each formed with an electrode pattern in which a plurality of first portions 1a and a plurality of second portions 1b wider than the first portions 1a are alternately arranged in the first direction. Each of the first portions 1a of the plurality of electrodes 1X is formed on a conductive layer different from that of the electrode 2Y to intersect the first portion 2a of the electrode 2Y in a planar manner. Each of the second portions 1b of the plurality of electrodes 1X is formed on the same conductive layer as that of the electrode 2Y separately from the electrode 2Y. In this embodiment, the first portion 1a of the electrode 1X is formed above the electrode 2Y.

Each of the second portions 1b of the plurality of electrodes 1X is covered with the insulating film 12 as in the case of the electrodes 2Y. Each of the first portions 1a of the plurality of electrodes 1X is disposed on the insulating film 12 to be covered with a protective layer 13 formed thereon.

The first portion 1a of the electrode 1X intersects the first portion 2a of the electrode 2Y in a planar manner, and is electrically and mechanically connected to two adjacent second portions 1b sandwiching the first portion 2a via a contact hole 12a formed through the insulating film 12 which is an interlayer insulating film between the first portion 1a of the electrode 1X and the electrode 2Y.

In other words, each of the plurality of electrodes 1X includes a first portion 1a formed on a conductive layer different from that of the electrode 2Y to intersect the electrode 2Y, and a second portion 1b formed on the same conductive layer as that of the electrode 2Y separately from the electrode 2Y. The first portion 1a of the electrode 1X is connected to the second portion 1b of the electrode 1X via the contact hole 12a formed through the insulating film 12 between the first portion 1a and the electrode 2Y.

The second portion 2b of the electrode 2Y is disposed between the first portions 1a in the two adjacent electrodes 1X in a plan view. The second portion 1b of the electrode 1X is disposed between the first portions 2a in the two adjacent electrodes 2Y in a plan view.

In other words, the electrode 2Y has a portion wider than that of a portion intersecting the electrode 1X between the electrode 2Y and the electrode 1X. The electrode 1X has a portion wider than that of a portion intersecting the electrode 2Y between the electrode 1X and the electrode 2Y.

The electrodes 1X and 2Y are made of highly transmissive materials, for example, transparent conductive materials such as indium tin oxides (ITOs).

FIG. 5 schematically illustrates capacities C1 and C3 between an observer's finger 50 and the electrode 1X and a capacity C2 between the observer's finger 50 and the electrode 2Y. The touch panel 20 of this embodiment detects a capacity difference of coupled capacities between the electrodes 1X and 2Y to detect touch position coordinates in a touch surface of the touch panel 20 touched by the observer's finger 50.

Referring to FIGS. 1 to 4, a manufacturing method for the touch panel 20 of this embodiment is described.

First, a first conductive film made of a transparent conductive material (e.g., ITO) is formed on the surface of the observer side of the substrate 11.

A first mask for the electrode pattern is formed on the first conductive film by using, for example, a positive resist. Then, the first conductive film is etched by using the first mask as an etching mask to form the electrode 2Y and the second portion 1b of the electrode 1x.

The first mask is removed, and the insulating film 12 made of, for example, a negative resist, is formed on the substrate 11 and on the electrode 2Y and the second portion 1b of the electrode 1x. In this step, the electrode 2Y and the second portion 1b of the electrode 1X are covered with the insulating film 12.

The contact hole 12a is formed in a necessary part of the insulating film 12. A second conductive film made of a transparent conductive material (e.g., ITO) is formed on the insulating film 12 and in the contact hole 12a.

A second mask for the electrode pattern is formed on the second conductive film by using, for example, a positive resist. Then, the second conductive film is etched by using the second mask as an etching mask to form the first portion 1a of the electrode 1X on the insulating film 12. In this step, the first portion 1a of the upper layer is electrically and mechanically connected to the second portion 1b of the lower layer via the contact hole 12a. The first portion 1a of the upper layer intersects the first portion 1a of the electrode 2Y of the lower layer.

Next, the second mask is removed, and the protective film 13 made of, for example, a negative resist, is formed on the insulating film 12 and on the first portion 1a of the electrode 1X, thereby forming a structure illustrated in FIGS. 1 to 4. In this step, the first portion 1a of the electrode 1X is covered with the protective film 13.

Formation of peripheral wiring line patterns can be inserted in an appropriate place among the steps.

Figure 9:
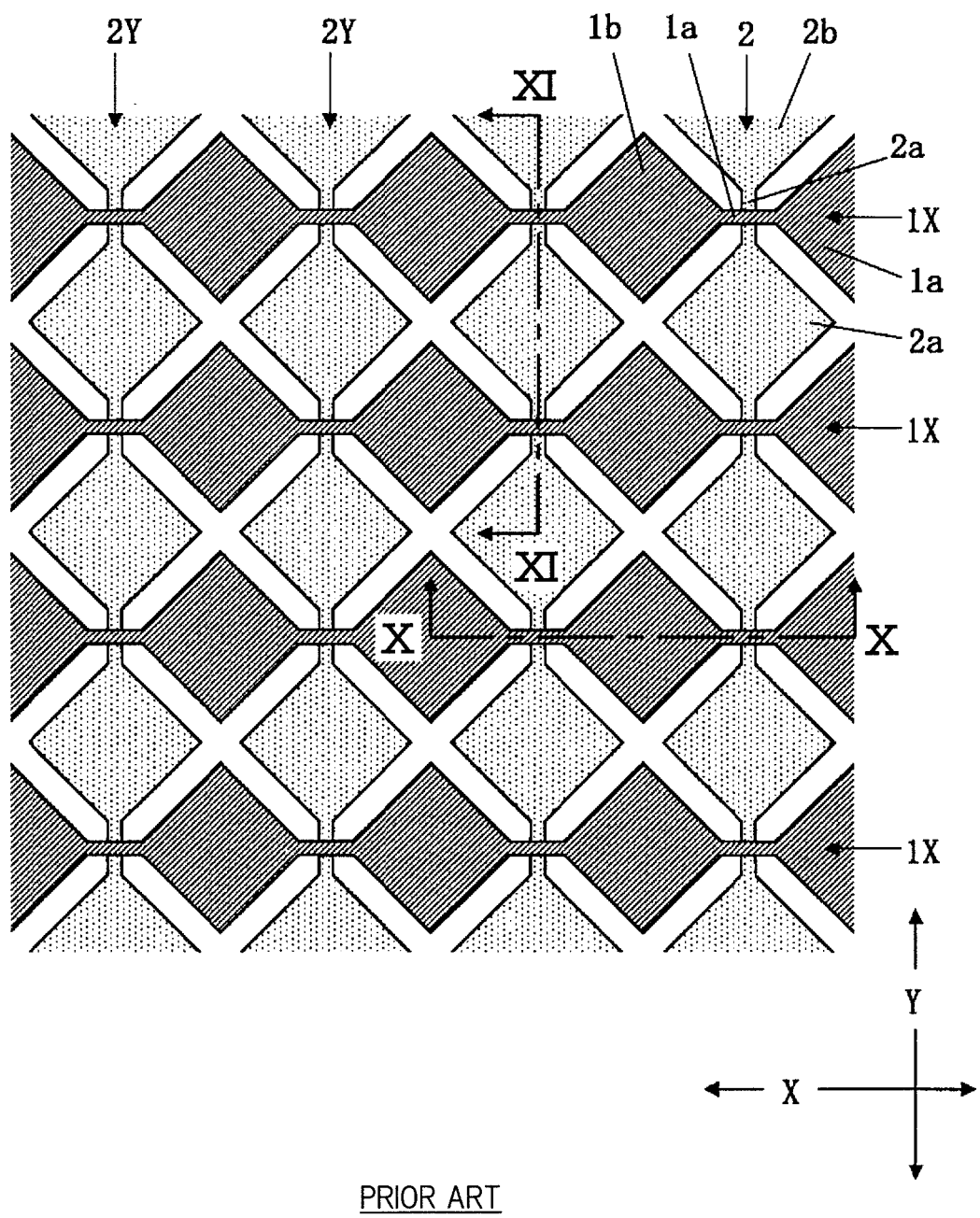
FIG. 9 is a plan diagram illustrating electrode patterns of a conventional capacitance coupling type touch panel.
Figure 10:
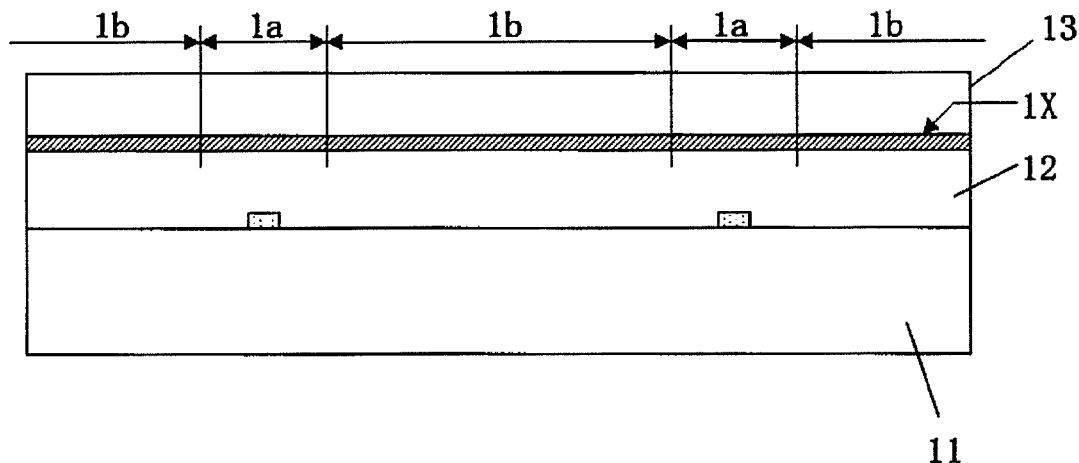
FIG. 10 is a sectional diagram illustrating a sectional structure cut on the line X-X of FIG. 9.
Figure 11:
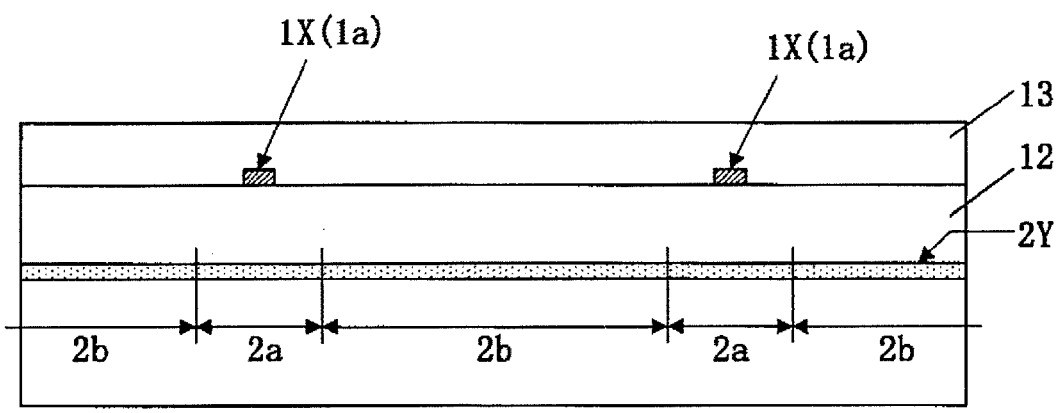
FIG. 11 is a sectional diagram illustrating a sectional structure cut on the line XI-XI of FIG. 9.

In a conventional capacitance coupling type touch panel, as illustrated in FIGS. 9 to 11, a plurality of electrodes 1X and a plurality of electrodes 2Y are formed on different conductive layers (lower and upper layers) via an insulating film 12. In the case of this electrode structure, distortion occurs in a protective film 13 formed on the insulating film 12 and the electrode 1X of the upper layer due to the electrode 1X of the upper layer, and optical path lengths are different between the lower and upper layers with respect to a reflected light. Thus, a color difference is generated between the electrode 2Y of the lower layer and the electrode 1X of the upper layer, making electrode patterns of the electrodes 1X and 2Y visible.

On the other hand, in the capacitance coupling type touch panel 20 of this embodiment, as illustrated in FIGS. 1 to 4, the electrode 1X includes the first portion 1a formed on the layer different from that of the electrode 2Y to intersect the electrode 2Y, and the second portion 1b formed on the same layer as that of the electrode 2Y separately from the electrode 2Y. The first portion 1a is connected to the second portion 1b via the contact hole 12a formed through the insulating film 12 between the first portion 1a and the electrode 2Y.

In the case of this electrode structure, the protective film 13 can be formed to be uniform, enabling suppression of distortion of the protective film 13 and visualization of the electrode patterns caused by a color difference due to the distortion of the protective film 13. As a result, deterioration of optical characteristics caused by visualization of the electrode patterns can be suppressed, and hence reduction in characteristics of the display device incorporating the touch panel 20 can be suppressed.

Portions in which color differences are generated can be reduced to a minimum, in other words, to only the first portion 1a of the electrode 1X, and hence visualization of electrode patterns caused by a color difference generated due to an optical path difference can also be suppressed. As a result, deterioration of optical characteristics caused by visualization of the electrode patterns can be suppressed, and hence reduction in characteristics of the display device incorporating the touch panel 20 can be suppressed.

When a defect occurs in the first portion 1a (bridge portion) formed on the upper layer, the defect can be repaired by re-executing the step of forming the first portion 1a, and deterioration of optical characteristics caused by visualization of the electrode patterns can be suppressed to improve processing performance.

Second Embodiment

Figure 6:
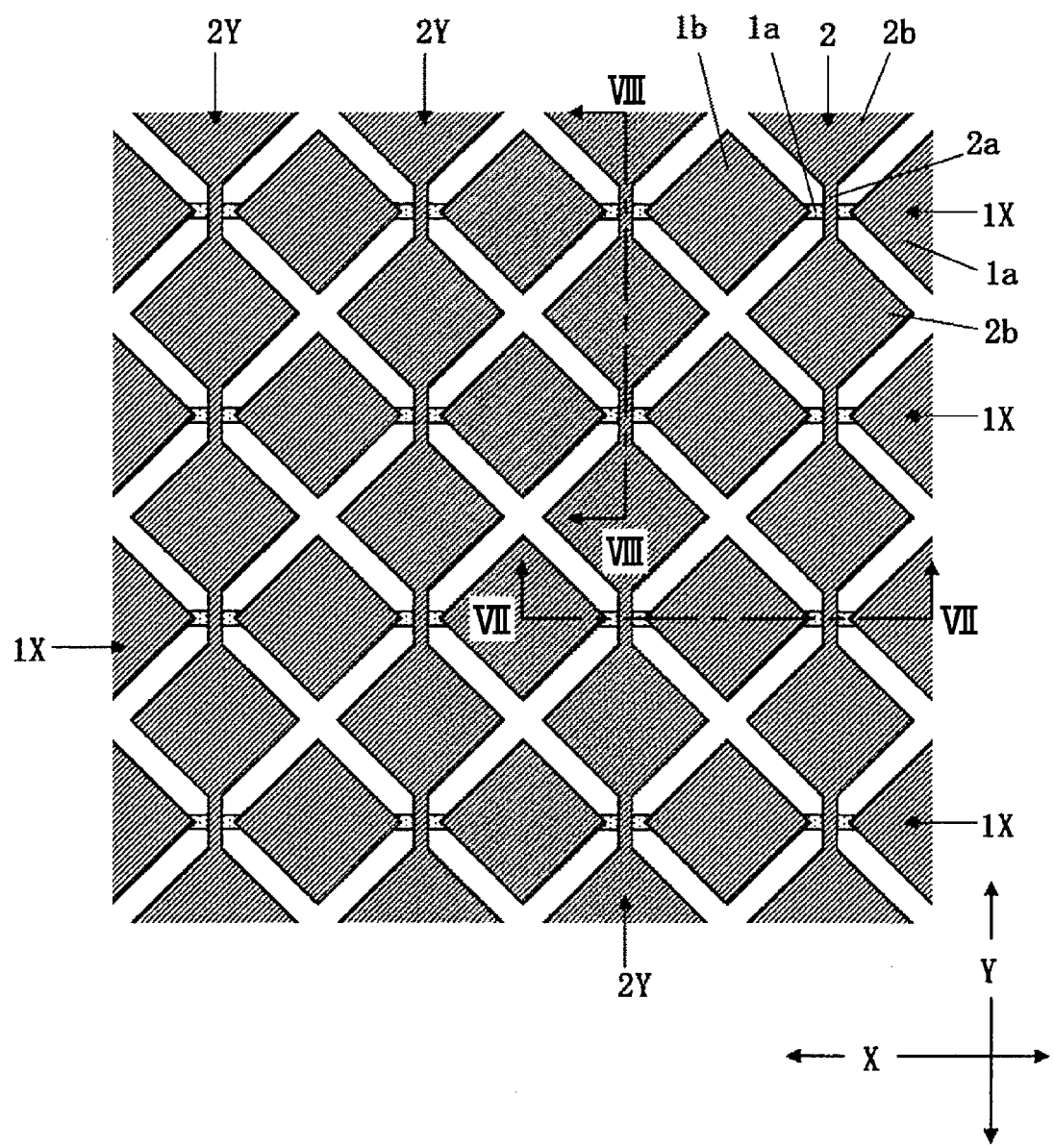
FIG. 6 is a plan diagram illustrating electrode patterns of a touch panel incorporated in a display device with a touch panel according to a second embodiment of the present invention.
Figure 7:
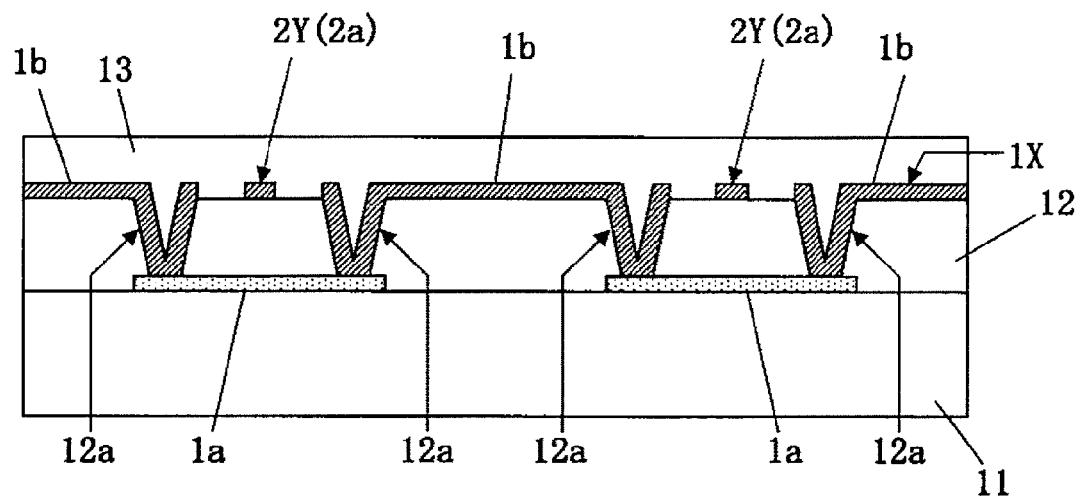
FIG. 7 is a sectional diagram illustrating a sectional structure cut on the line VII-VII of FIG. 6.
Figure 8:
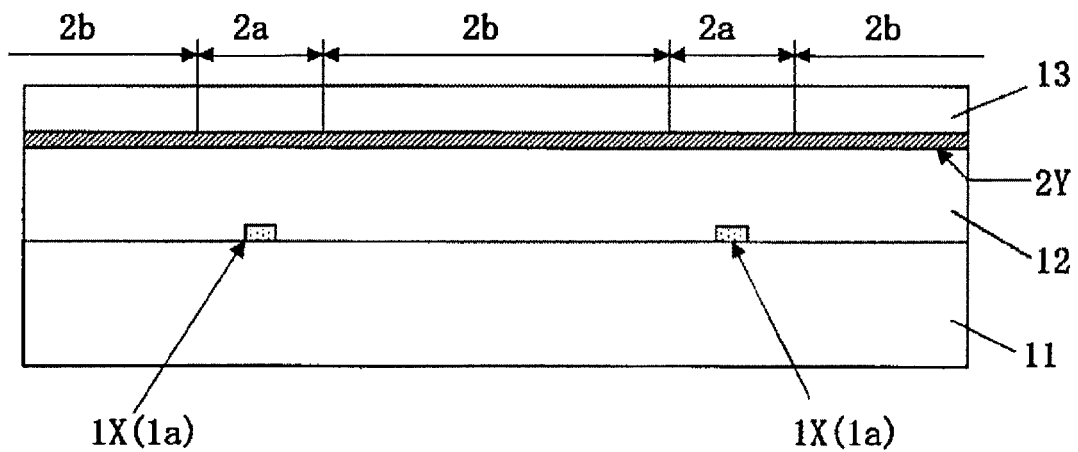
FIG. 8 is a sectional diagram illustrating a sectional structure cut on the line VIII-VIII of FIG. 6.

FIGS. 6 to 8 illustrate a display device with a touch panel according to a second embodiment of the present invention:

FIG. 6 is a plan diagram illustrating electrode patterns of a touch panel incorporated in the display device with the touch panel;

FIG. 7 is a sectional diagram illustrating a sectional structure cut on the line VII-VII of FIG. 6; and FIG. 8 is a sectional diagram illustrating a sectional structure cut on the line VIII-VIII of FIG. 6.

The display device with the touch panel of the second embodiment is basically similar in configuration to that of the first embodiment, and is different as follows.

In the first embodiment, as illustrated in FIGS. 1 to 4, the electrode 2Y and the second portion 1b of the electrode 1X are formed on the lower conductive layer, and the first portion 1a of the electrode 1X is formed on the upper conductive layer. In the second embodiment, however, as illustrated in FIGS. 6 to 8, a first portion 1a of an electrode 1X is formed on a lower conductive layer, and an electrode 2Y and a second portion 1b of an electrode 1X are formed on an upper conductive layer.

The first portion 1a (lower layer in this embodiment) of the electrode 1X intersects a first portion 2a of the electrode 2Y, and is electrically and mechanically connected to two adjacent second portions 1b (upper layer in this embodiment) sandwiching the first portion 2a via a contact hole 12a formed through an insulating film 12 which is an interlayer insulating film between the first portion 1a of the electrode 1X and the electrode 2Y.

Also in the second embodiment, visualization of electrode patterns caused by a color difference due to distortion of a protective film 13 and visualization of electrode patterns caused by a color difference due to an optical path difference can be suppressed. Thus, deterioration of optical characteristics caused by visualization of the electrode patterns can be suppressed, and reduction in characteristics of the display device incorporating the touch panel 20 can be suppressed.

The above-mentioned embodiments have been directed to the display device with the touch panel, which includes the touch panel on the liquid crystal display panel as an example of the display panel. However, the present invention is not limited to this. The present invention can be applied to a display device with a touch panel which includes the touch panel on another display panel such as an organic EL display panel or an inorganic EL display panel.

The invention which has been made by the inventors of the present invention has specifically been described based on the embodiments. Not limited to the embodiments, however, various changes and modifications can be made without departing from the gist of the invention.

What is claimed is:

1. A manufacturing method of a touch panel comprising the steps of:
   providing a substrate;
   forming a first conductive film on the substrate;
   forming a first mask on the first conductive film;
   etching the first conductive film to form a plurality of electrode portions and a plurality of lower intersect portions of the touch panel;
   removing the first mask;
   forming an insulating film made of a negative resist on the first conductive film;
   forming a contact hole above one of the plurality of electrode portions by removing the insulating film;
   forming a second conductive film on the insulating film;
   forming a second mask on the second conductive film;
   etching the second conductive film to form an upper intersect portion connected between two adjacent electrode portions of the plurality of electrode portions via the contact hole and intersecting with one of the plurality of lower intersect portions;
   removing the second mask; and
   forming a protective film from a negative resist on the second conductive film over the insulating film.

2. The manufacturing method of the touch panel according to claim 1, wherein the first conductive film is made of a transparent conductive material.

3. The manufacturing method of the touch panel according to claim 1, wherein the first mask is made of a positive resist.

4. The manufacturing method of the touch panel according to claim 1, wherein the second mask is made of a positive resist.

5. The manufacturing method of the touch panel according to claim 1, wherein the protective film is provided in the contact hole.

6. A manufacturing method of a touch panel comprising the steps of:
   providing a substrate;
   forming a first conductive film on the substrate;
   forming a first mask on the first conductive film;
   etching the first conductive film to form an electrode portion of an X electrode, an electrode portion of a Y electrode, and an intersect portion of the Y electrode;
   removing the first mask;
   forming an insulating film made of a negative resist on the first conductive film;
   forming a contact portion of the electrode portion of the X electrode by removing the insulating film;
   forming a second conductive film on the insulating film;
   forming a second mask on the second conductive film;
   etching the second conductive film to form an intersect portion of the X electrode connected to the contact portion of the X electrode and intersecting with the intersect portion of the Y electrode;
   removing the second mask; and
   forming a protective film from a negative resist on the second conductive film over the insulating film.

7. The manufacturing method of the touch panel according to claim 6, wherein the first conductive film is made of a transparent conductive material.

8. The manufacturing method of the touch panel according to claim 6, wherein the first mask is made of a positive resist.

9. The manufacturing method of the touch panel according to claim 6, wherein the second mask is made of a positive resist.

10. The manufacturing method of the touch panel according to claim 6, wherein the protective film is provided in the contact portion.

11. A manufacturing method of a touch panel comprising the steps of:
    providing a substrate;
    forming a first conductive film on the substrate,
    forming a first mask on the first conductive film;
    etching the first conductive film to form a lower intersect portion;
    removing the first mask;
    forming an insulating film made of a negative resist on the first conductive film;
    forming a contact hole of the lower intersect portion by removing the insulating film;
    forming a second conductive film on the insulating film;
    forming a second mask on the second conductive film;
    etching the second conductive film to form an upper intersect portion and electrode portions;
    removing the second mask; and
    forming a protective film from a negative resist on the second conductive film over the insulating film;
    wherein the lower intersect portion connects between two adjacent electrode portions via the contact hole and intersects with the upper intersect portion.

12. The manufacturing method of the touch panel according to claim 11, wherein the first conductive film is made of a transparent conductive material.

13. The manufacturing method of the touch panel according to claim 11, wherein the first mask is made of a positive resist.

14. The manufacturing method of the touch panel according to claim 11, wherein the second mask is made of a positive resist.

15. The manufacturing method of the touch panel according to claim 11, wherein the protective film is provided in the contact hole.

* * * * *